United States Patent [19]

Scott et al.

[11] 3,958,213

[45] May 18, 1976

[54] ADAPTIVE GAIN CONTROL AND METHOD FOR SIGNAL PROCESSOR

[75] Inventors: Richard W. Scott, Cupertino; Marvin D. Laymon, Milpitas, both of Calif.

[73] Assignee: GTE Sylvania Incorporated, Mountain View, Calif.

[22] Filed: Jan. 3, 1975

[21] Appl. No.: 538,348

[52] U.S. Cl. ............................ 340/261; 340/15.5 GC; 340/16 R; 340/258 D
[51] Int. Cl.² ........................................ G08B 13/16
[58] Field of Search ........ 340/258 R, 258 B, 258 D, 340/261, 16 R, 15.5 GC

[56] References Cited
UNITED STATES PATENTS

| | | | |
|---|---|---|---|
| 2,838,742 | 6/1958 | McManis | 340/15.5 GC |
| 3,149,333 | 9/1964 | Campbell | 340/15.5 GC |
| 3,150,327 | 9/1964 | Taylor | 340/15.5 GC |
| 3,569,923 | 3/1971 | Naubereit et al. | 340/261 X |
| 3,614,724 | 10/1971 | Brown | 340/261 X |
| 3,686,658 | 8/1972 | Wilt | 340/261 |
| 3,702,998 | 11/1972 | Lucas | 340/261 X |
| 3,714,622 | 1/1973 | Wilhelmsen | 340/16 R |
| 3,745,552 | 7/1973 | Wilt | 340/261 |
| 3,903,512 | 9/1975 | Laymon | 340/261 |

*Primary Examiner*—David L. Trafton
*Attorney, Agent, or Firm*—John F. Lawler

[57] ABSTRACT

An adaptive gain control for a signal processor of an intrusion detection system comprises a circuit which utilizes the weighted summation of selected characteristics of sensed signals for producing optimum control of the gain of the circuit for discriminating between target and non-target signals more effectively. The parameters of signal envelope, envelope amplitude variance and signal frequency obtained from a processor such as that described in U.S. Pat. No. 3,696,369 are fed to a summing amplifier through resistors having weighted values calculated from previously recorded seismic signals obtained from several previously identified sites which, taken as a group, are representative of the type or types of sites in which the detection system is to be installed. The output of this summing amplifier is a control signal which is applied to a controlled instrumentality such as an amplifier or attenuator for optimizing signal level and thus enabling better circuit discrimination between target and non-target signals at a particular site.

This invention further comprehends a method of processing signals for optimizing discrimination between desired and undesired signals by deriving selected signal parameters of signal envelope, amplitude variance and frequency, conditioning those parameters by assigning weights to them in accordance with data derived from prerecorded signals taken from sites representative of intended system installation and classified as target or non-target signals, summing these conditioned signal parameters in a summing amplifier to derive a control signal and applying the control signal to a controlled instrumentality which varies the gain of the circuit for optimizing identification of target signals and rejection of non-target signals.

13 Claims, 3 Drawing Figures

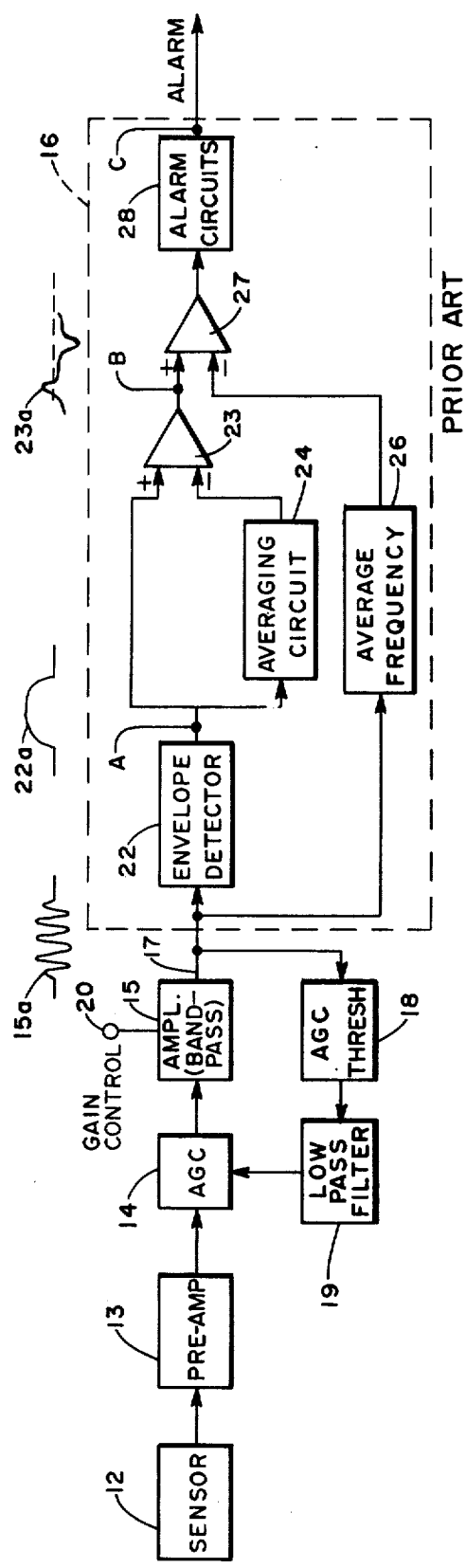
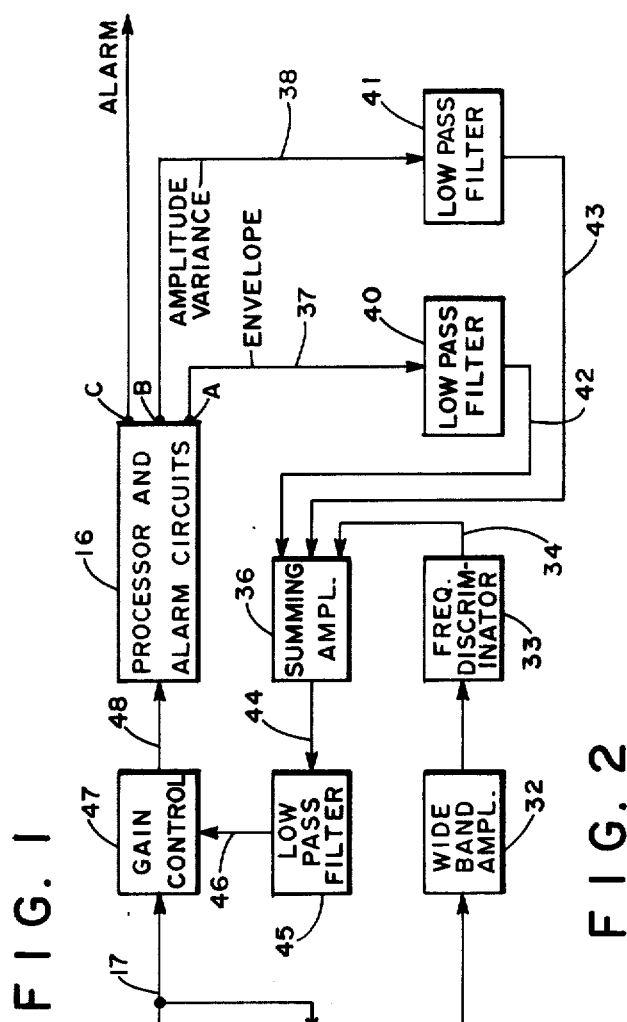
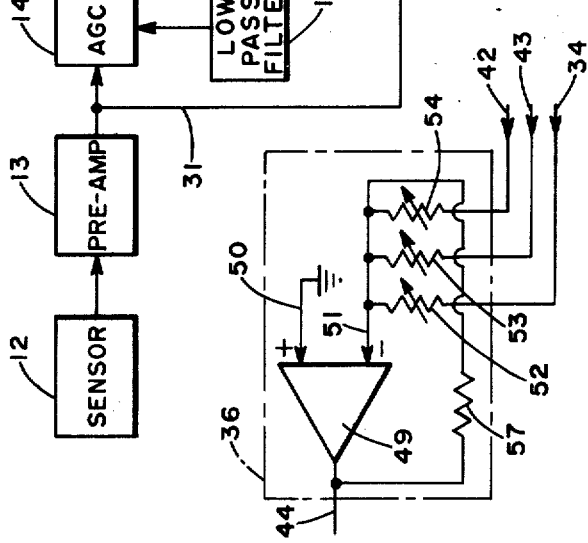

ADAPTIVE GAIN CONTROL AND METHOD FOR SIGNAL PROCESSOR

BACKGROUND OF THE INVENTION

This invention herein described was made under a contract with the Department of the Army.

This invention relates to signal processing techniques and more particularly to a signal processor and method for detecting and discriminating between various targets which generate signals. A useful application of the invention is in the processing of seismically generated signals.

U.S. Pat. No. 3,696,369, assigned to the assignee of this invention, discloses a seismic signal processing circuit which distinguishes between various types of targets on the basis of their seismic signatures. For example, a burst or short pulse type of seismic signal characteristic of the footstep of a walking man is distinguished from a continuous seismic signal which is characteristic of a helicopter on the basis of differences in frequency and signal duration. Such a processor has been very effective in discriminating between targets and non-targets and so have contributed considerably to the detection of selected signals with minimum false alarms.

In order to further optimize the performance of processors including the one described in the foregoing patent, it is necessary to take into account different seismic conductivity at the various sites under surveillance. The attenuation of a seismic signal with increasing source-to-detector distance can vary over wide ranges at different locations. Attenuation may vary from about 6 db or less for each doubling of distance of 14 db or more for doubling of distance. The signal output of a typical geophone in response to a man walking at a distance of 30 feet can vary from about 10 microvolts at an insensitive site to one millivolt at an unusually sensitive site. To amplify these signals to a reasonable processing level of 2 volts requires an amplifier voltage gain of 106 db in one case and only 66 db in the other case.

The usual practice under these conditions is to manually set a gain control at the actual site to obtain optimum performance or if the site characteristics are known, the gain can be preset. Such field adjustment is not only tedious and time consuming but also requires the services of a relatively skilled technician, thereby complicating the installation procedure and further increasing its cost. Another alternative is to preset the gain to some compromise level such as 98 db and accept less detection range at poor sites and greater detection range at sensitive sites with the attendant risk of poorer false alarm rejection.

OBJECTS AND SUMMARY OF THE INVENTION

A general object of this invention is the provision of a control circuit for processors which permits automatic adjustment of the processor for optimum performance at any surveillance site.

Another object is to eliminate the need for a manual gain control in such processors.

A further object is the provision of a method of optimizing the target selection capability of the signal processor of a detection system based on seismic signal conductivity at any site.

A more specific object is the provision of seismic signal detection apparatus and a method for weighing selected seismic signal parameters derived from a site or group of sites which have signal characteristics representative of the desired installation site, and combining these weighted parameters to obtain a control signal which determines the optimum gain of the processing circuit of any site similar to one or more of those sites from which data was used for the initial programming.

These and other objects of the invention are achieved with a circuit for controlling system gain with a signal derived by summing signal parameters such as envelope amplitude, envelope amplitude variance and frequency that have been conditioned or qualified in accordance with prerecorded signals from identified targets, false alarm sources and normal background noise at one or more sites similar to the future installation site. The output of this summing circuit is a control signal whose characteristic varies in accordance with the weighted inputs to optimize the capability of the processor circuit for discriminating between desired (target) and undesired (non-target) signals. The invention also comprehends the method of optimizing the false alarm discrimination capability of a signal processor with prerecorded data from the future installation site or from one or more similar sites by varying the processor gain in accordance with data derived from actual sensings.

BRIEF DESCRIPTION OF THE DRAWINGS

FIG. 1 is a schematic block diagram of a seismic intrusion detection system of the prior art;

FIG. 2 is a schematic block diagram of a seismic detection system of the type shown in FIG. 1 in which the processing circuits are modified in accordance with this invention; and FIG. 3 is a schematic diagram of a preferred form of summing amplifier constituting part of the processor embodying this invention.

DESCRIPTION OF PREFERRED EMBODIMENT

Referring now to the drawings, FIG. 1 illustrates a signal processor 10 of the type described in U.S. Pat. No. 3,696,369 and comprising seismic sensor means 12 such as a ground implanted geophone which converts seismic vibrations into electrical signals. These signals pass successively through preamplifier 13, AGC amplifier 14 and bandpass amplifier 15 before being applied to processor and alarm circuits enclosed within the broken line rectangle 16 via output line 17. The output of bandpass amplifier 15 is also fed back to AGC amplifier 14 through threshold circuit 18 and low pass filter 19 which serve to increase the dynamic range of the system and thereby preserve the amplitude variation characteristics of the signal. The sensitivity of the system is adjusted by a manual gain control 20 on amplifier 15 and is used to adapt the system to the seismic conductivity characteristics of the particular site after installation.

Processor and alarm circuits 16 comprise an envelope detector 22 connected to line 17 and having its output at A connected as one input directly to differential amplifier 23 and as the other input to amplifier 23 through an averaging circuit 24. The output of amplifier 15 is also connected through an average frequency circuit 26 to a second differential amplifier 27. The output of amplifier 23 and B constitutes the other input to amplifier 27 which sums these inputs and produces an output which is connected to alarm circuits 28 for operating an alarm mechanism not shown.

A typical seismic signal detected by sensor 12 appears as waveform 15a. Envelope detector 22 responds to this input signal to produce an envelope signal 22a having an amplitude that is proportional to the instantaneous maximum amplitude of the seismic signal. Differential amplifier 23 combines detected signal 22a and the average signal output of circuit 24 for producing the amplitude variance signal 23a which is fed to amplifier 27 as one of its inputs. The amplitude of signal 23a is proportional to the difference between the time varying values of the instantaneous amplitude of and the average value of the detected signal 22a. Reference to the variation of signal 22a reveals that the circuit accentuates abrupt changes in the amplified seismic signal 15a.

Alarm circuits 28 comprise threshold and counter circuits which determine the number of times the threshold is exceeded within a predetermined time and give an alarm when predetermined criteria are met.

The foregoing processor circuits are more fully and completely described and claimed in U.S. Pat. No. 3,696,369 and do not per se constitute this invention.

In order to adapt the above-described detection circuit to the ground and atmospheric conditions of the site at which it is installed, the gain of the circuit is adjusted by control 20 after installation. Since seismic conductivity varies from site to site, this gain adjustment is an important step in optimizing the detection capability of the circuits while maintaining false alarms at a minimum.

In accordance with this invention the elimination of the need for manual control of the processor is accomplished by operating the amplifier at the maximum required gain, for example, 106 db. A signal controlled attenuator which is controlled by a weighted sum of two or more measurements of features derived from the basic seismic signal controls the signal level applied to the processing circuits. The signal attenuation can be increased by target signals, false alarm signals or background noise signals. In practice, the attenuator has little effect on the signal at an insensitive site but strongly reduces the signal at a sensitive site. The automatic attenuator (or gain control) helps to maintain the optimum signal level applied to the processor as distinct from the amplifier AGC which serves to maintain amplifier linearity over a wide range of signal levels.

The following description of a preferred embodiment of this invention with reference to FIG. 2 concerns a modification of the circuit shown in FIG. 1 and therefore like reference characters indicate like parts in the drawings.

In accordance with this invention, the capability of signal processing circuits of the type described above to discriminate more effectively between true and false alarm signals so as to minimize false alarms to an even greater degree is achieved by automatically adjusting the gain of the circuit on the basis of the algebraic sum of weighted values of the frequency, envelope and amplitude variance of the detected seismic signal. It has been observed that the gain of the system is inversely proportional to the values of each of the envelope and amplitude variance parameters and is directly proportional to the value of the frequency parameter. For example, as the envelope increases the gain decreases proportionally; likewise the gain decreases with an increase in amplitude variance and decreases with an increase in frequency of the signal.

The frequency parameter is derived on line 31, see FIG. 2, which connects the output of preamplifier 13 to a wideband amplifier 32 which in turn is connected to frequency discriminator 33, such an amplitude limiter, high pass filter, rectifier and low pass filter circuit. The amplitude of the output of discriminator 33 on line 34 varies with signal frequency and constitutes the aforementioned frequency parameter which is fed as one input to a summing amplifier 36. Alternatively, the frequency parameter on line 34 may be derived directly from average frequency circuit 26 in FIG. 1.

The signal envelope parameter is derived from the output of envelope detector 22 by line 37 connected to the detector output at point A as indicated in FIGS. 1 and 2. Similarly, the amplitude variance parameter is derived by line 38 connected at point B to the output of differential amplifier 23. Lines 37 and 38 are connected to low pass filters 40 and 41, respectively, which smooth or average these signals, and the outputs of these filters on lines 42 and 43, respectively, constitute the second and third inputs to summing amplifier 36 as shown.

The output of summing amplifier 36 is a gain control signal proportional to the weighted sum of the frequency, envelope amplitude and amplitude variance of the detected signal and is applied on line 44 through low pass filter 45 to the control terminal 46 of a gain control circuit 47, which may be a voltage controlled amplifier or an attenuator or the like. The input to gain control circuit 47 is received on line 17 from the output of bandpass amplifier 15 and its output on line 48 is applied to the processor and alarm circuits 16 as was the output of amplifier 15 in the prior art system shown in FIG. 1. In essence, gain control circuit 47, in response to the control signal at terminal 46, adjusts the gain of the circuit as does gain control 20 in the prior art system; however, gain control 47 is automatically responsive to the seismic conductivity conditions of the particular site at which the system is installed and accordingly varies the gain of the circuit so as to optimumly discriminate against false alarm signals indigenous to that paricular site.

In order to achieve this adaptive gain characteristic in control circuit 47, the frequency, amplitude variance and envelope parameter inputs on lines 34, 43 and 42, respectively, are weighted in accordance with the site characteristics and these variously weighted values are summed or algebraically added together. This is accomplished in summing amplifier 36 which comprises a differential amplifier 49, see FIG. 3, having a grounded input line 50 and a second input line 51 to which parameter lines 34, 43 and 42 are connected respectively through variable attenuators or resistors 52, 53 and 54, respectively. Output line 44 of amplifier 49 is connected through resistor 57 to input line 51 to provide a feedback for stabilizing operation of the amplifier.

The procedure for determining the resistance values to which resistors 52, 53 and 54 are adjusted is now described. Seismic sensings of target and non-target objects and conditions at the selected site are made and recorded, such as on magnetic tape, prior to installation of the system. The "true" or "false" nature of the recorded seismic signals are identified during the course of recording these signals. The recorded seismic signals are then fed into a computer which has been appropriately programmed to calculate the selected values of resistors 52, 53 and 54 in order to produce the gain control signal which optimizes circuit discrimination against signals from false or undesired objects or conditions.

By way of example, a computer that has been successfully employed to calculate the values of these resistors is an IBM 370/145. The program implemented on the computer was derived using Fischer's linear discriminant algorithm as contained in the publication entitled "IBM Scientific Subrouting Package" (IBM publication No. GH20-0205-4 dated August 1970) and available from IBM at its home or branch offices. This publication contains a sample main program MDISC (pp. 428–429) and three subroutines required to compute a set of weights that are proportional to the required resistors values. The subroutines are DMATX (p. 53), MINV (p. 118) and DISCR (p. 54). This publication is fully instructive to a computer programmer of ordinary skill on the use of the discriminant function (weight selection) program. The values of resistors 52, 53 and 54 are directly related to the weights obtained by running the computer program with the tape data base. The weights represent the summing amplifier gains (lines 34, 42, 43). The gains are computed by the formula $$\text{Gain} = R_F/R_{IN}$$

where $R_F$ is the amplifier feedback resistor (57) and $R_{IN}$ (resistors 52, 53, 54) is the input resistor.

In order to duplicate actual operating conditions as nearly as possible in the computation of the values of resistors 52, 53 and 54, the tape recorded data on actual seismic sensings are fed into preamplifier 13 and samples of the outputs on lines 34, 43 and 42 (i.e., the inputs to summing amplier 36) are fed into the computer programmed as indicated above. The resultant values of the weights (and the associated resistors) as calculated by the computer therefore reflect all relevant conditions including processor circuit characteristics which have an effect on the capability of the circuit to discriminate against false alarms. A plurality of different seismic signatures recorded on the tape and identified as targets or non-targets are processed in this manner in the computer which calculates the optimum gain level for discriminating between true alarms and false alarms. By way of example, 45 to 50 different signatures have been use to derive useful values of resistors 52, 53 and 54.

While gain control circuit 47 is illustrated and described above as being connected to the input of processor and alarm circuits 16, this control of gain could be applied at other points in the system without departing from the principle of the invention. For example, circuit 47 could be connected between amplifier 27 and alarm circuits 28.

This invention also comprehends the method of automatically controlling the gain of seismic signal processor by recording a plurality of known seismic sensings from the intended installation site or from representative sites, calculating weighting values based on these sensings and assigning these values to selected signal parameters (discriminants), respectively, derived from the processor, summing the weighted signal parameters to obtain a control signal, and applying the control signal to a gain control circuit in the processor for automatically adjusting the gain thereof in accordance with changes in the weighted signal parameters. In the preferred embodiment of the invention, the parameters used are signal envelope, amplitude variance and frequency.

The practice of this invention is not limited to processor systems which operate on seismically induced signals but also has utility in systems which similarly process electrical signals derived from other transducers such as acoustoelectric, opto-electric, microwave, and piezoelectric sensing devices. The invention thus may be utilized with advantage in a processor system having any kind of a transducer that produces an electrical signal output.

What is claimed is:

1. In a signal processing system having a sensor for producing a first electrical signal corresponding to the sensed condition at one site, an envelope detector responsive to said first signal for producing a second signal that is a measure of the instantaneous amplitude of the envelope of the signal, comparator means responsive to said second signal for producing a third signal that is a measure of the difference between the instantaneous amplitude of and the average value of said envelope, means responsive to said first signal for producing a fourth signal having an amplitude that is a measure of the frequency of said first signal, and circuit means responsive to said third signal for producing an alarm, the improvement of means for automatically controlling the gain of the processing system comprising means for changing the gain of said signal processing system, means for modifying said second, third and fourth signals to have predetermined weighted values, respectively, corresponding to ambient conditions at said one site, and means for summing said modified second, third and fourth signals to produce a control signal, said control signal being applied to said gain changing means for automatically varying the gain of said system.

2. The system according to claim 1 in which said summing means comprises a summing amplifier, said modifying means comprising resistive means connected between the sources of said second, third and fourth signals, respectively, and said summing amplifier, said weighted values being proportional to the values of said resistive means.

3. The system according to claim 2 in which each of said resistive means comprises a variable resistor.

4. The system according to claim 2 in which said gain changing means comprises a voltage controlled attenuator.

5. In a seismic signal processing system having a seismic sensor for producing a first electrical signal corresponding to the sensed vibrations of targets and non-targets at one site, an envelope detector responsive to said first signal for producing a second signal that is a measure of the instantaneous amplitude of the envelope of the seismic signal, comparator means responsive to said second signal for producing a third signal that is a measure of the difference between the instantaneous amplitude of and the average value of said envelope, means responsive to said first signal for producing a fourth signal having an amplitude that is a measure of the frequency of said first signal, and circuit means responsive to said third signal for producing an alarm, the improvement of means for automatically controlling the gain of the processing system comprising a voltage controlled gain changer connected in said system for changing the gain of the signal being processed, said gain changer having a control terminal, means for separately modifying said second, third and fourth signals to have predetermined weighted values, respectively, corresponding to representative sensed vibrations at said one site, and amplifier means having an input for receiving said modified signals and producing an output corresponding to the summation of same, said output of the amplifier means being connected to said control terminal of the gain changer.

6. The system according to claim 5 in which said modifying means comprise resistors for said second, third and fourth signals, respectively, said resistors having predetermined values corresponding to optimum gain characteristics in said system for passing target generated signals and rejecting non-target generated signals.

7. The method of processing signals in a signal processor for optimizing discrimination between target and nontarget sources comprising the steps of deriving selected signal parameters of envelope amplitude, envelope amplitude variance, and frequency from said processor, modifying each of said signal parameters to respective predetermined values corresponding to said optimized discrimination operation of said processor, summing said modified parameters to produce a control signal, and changing the gain of said processor in accordance with changes in said control signal.

8. The method according to claim 7 in which signals corresponding to said parameters are attenuated by resistors to produce said predetermined values.

9. The method according to claim 8 in which the values of said resistors are derived from a plurality of prerecorded sensings of identified target and non-target sources whereby said control signal produces optimum gain variations in said processor.

10. The method of controlling system gain in a seismic signal processor having a seismic sensor capable of producing electrical signals corresponding to vibrations generated by target and non-target sources, said processor having circuits producing signal characteristics corresponding to signal envelope amplitude, signal envelope amplitude variance and signal frequency, comprising prerecording a plurality of known target and nontarget signals from sites having seismic conductivity characteristics representative of the intended installation site, deriving from said prerecorded signals optimized values of said signal characteristics corresponding to optimum system discrimination against non-target sources in favor of target sources, modifying said signal characteristics as produced by said processor to have said optimized values, summing the optimized values of said signal characteristics to produce a control signal, and changing the gain of said processor in accordance with changes in said control signal.

11. A method of processing signals in a processor for optimizing discrimination between target and non-target signals comprising the steps of deriving selected signal parameters of signal envelope, amplitude variance and frequency, conditioning at least two of said parameters by assigning weights to them in accordance with data derived from prerecorded signals taken from sites reprensentative of intended system installation and classified as target or nontarget signals, summing said conditioned signal parameters to derive a control signal, and applying the control signal to a controlled instrumentality which varies the gain of the processor for optimizing identification of target signals and rejection of non-target signals.

12. In a signal processing system having a sensor for producing an electrical signal corresponding to the sensed condition at one site, an envelope detector responsive to said electrical signal for producing a first parameter signal that is a measure of the instantaneous amplitude of the envelope of the signal, comparator means responsive to said first parameter signal for producing a second parameter signal that is a measure of the difference between the instantaneous amplitude of and the average value of said envelope, means responsive to said electrical signal for producing a third parameter signal having an amplitude that is a measure of the frequency of said electrical signal, and circuit means responsive to said second parameter signal for producing an alarm, the improvement of means for automatically controlling the gain of the processing system comprising means for changing the gain of said signal processing system, means for modifying at least two of said parameter signals to have predetermined weighted values, respectively, corresponding to ambient conditions at said one site, and means for summing said modified parameter signals to produce a control signal, said control signal being applied to said gain changing means for automatically varying the gain of said system.

13. The system according to claim 12 in which said summing means comprises a summing amplifier, said modifying means comprising resistive means connected between the sources of said parameter signals, respectively, and said summing amplifier, said weighted values being proportional to the values of said resistive means.

* * * * *